(12) United States Patent
Ma et al.

(10) Patent No.: US 11,721,760 B2
(45) Date of Patent: Aug. 8, 2023

(54) DOPANT CONCENTRATION BOOST IN EPITAXIALLY FORMED MATERIAL

(71) Applicant: Taiwan Semiconductor Manufacturing Company, Ltd., Hsinchu (TW)

(72) Inventors: Chih-Yu Ma, Hsinchu (TW); Zheng-Yang Pan, Zhubei (TW); Shih-Chieh Chang, Taipei (TW); Cheng-Han Lee, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 17 days.

(21) Appl. No.: 16/690,194

(22) Filed: Nov. 21, 2019

(65) Prior Publication Data

US 2020/0091343 A1 Mar. 19, 2020

Related U.S. Application Data

(62) Division of application No. 15/418,023, filed on Jan. 27, 2017, now Pat. No. 10,490,661.

(60) Provisional application No. 62/427,752, filed on Nov. 29, 2016.

(51) Int. Cl.
| | |
|---|---|
| *H01L 29/78* | (2006.01) |
| *H01L 29/66* | (2006.01) |
| *H01L 21/02* | (2006.01) |
| *H01L 21/306* | (2006.01) |
| *H01L 29/04* | (2006.01) |
| *H01L 29/08* | (2006.01) |
| *H01L 29/165* | (2006.01) |
| *H01L 29/167* | (2006.01) |

(52) U.S. Cl.
CPC .... *H01L 29/7848* (2013.01); *H01L 21/02527* (2013.01); *H01L 21/02532* (2013.01); *H01L 21/30604* (2013.01); *H01L 29/04* (2013.01); *H01L 29/0847* (2013.01); *H01L 29/165* (2013.01); *H01L 29/167* (2013.01); *H01L 29/66628* (2013.01); *H01L 29/66636* (2013.01)

(58) Field of Classification Search
CPC combination set(s) only.
See application file for complete search history.

(56) References Cited

U.S. PATENT DOCUMENTS

| | | | |
|---|---|---|---|
| 7,667,271 B2 | 2/2010 | Yu et al. | |
| 8,362,575 B2 | 1/2013 | Kwok et al. | |
| 8,367,498 B2 | 2/2013 | Chang et al. | |

(Continued)

*Primary Examiner* — Julio J Maldonado
*Assistant Examiner* — Stanetta D Isaac
(74) *Attorney, Agent, or Firm* — Slater Matsil, LLP

(57) ABSTRACT

A dopant boost in the source/drain regions of a semiconductor device, such as a transistor can be provided. A semiconductor device can include a doped epitaxy of a first material having a plurality of boosting layers embedded within. The boosting layers can be of a second material different from the first material. Another device can include a source/drain feature of a transistor. The source/drain feature includes a doped source/drain material and one or more embedded distinct boosting layers. A method includes growing a boosting layer in a recess of a substrate, where the boosting layer is substantially free of dopant. The method also includes growing a layer of doped epitaxy in the recess on the boosting layer.

20 Claims, 10 Drawing Sheets

(56) References Cited

U.S. PATENT DOCUMENTS

| | | |
|---|---|---|
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 2007/0235802 A1* | 10/2007 | Chong ............ H01L 21/823814 257/346 |
| 2011/0068407 A1 | 3/2011 | Yeh et al. |
| 2013/0011983 A1 | 1/2013 | Tsai et al. |
| 2013/0049101 A1* | 2/2013 | Hsiao ................ H01L 21/02529 257/329 |
| 2013/0109144 A1 | 5/2013 | Kim et al. |
| 2014/0252412 A1 | 9/2014 | Tsai et al. |
| 2015/0255606 A1 | 9/2015 | Cheng et al. |
| 2016/0027918 A1* | 1/2016 | Kim .................... H01L 29/7848 257/401 |
| 2018/0151730 A1 | 5/2018 | Ma et al. |

\* cited by examiner

DOPANT CONCENTRATION BOOST IN EPITAXIALLY FORMED MATERIAL

PRIORITY CLAIM

This application is a divisional of U.S. patent application Ser. No. 15/418,023, filed on Jan. 27, 2017 and entitled "Dopant Concentration Boost in Epitaxially Formed Material," which claims the benefit of U.S. Provisional Application No. 62/427,752, filed on Nov. 29, 2016 and entitled "Epitaxy Phosphorous Concentration Boost with Silicon-Based Film," which application is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
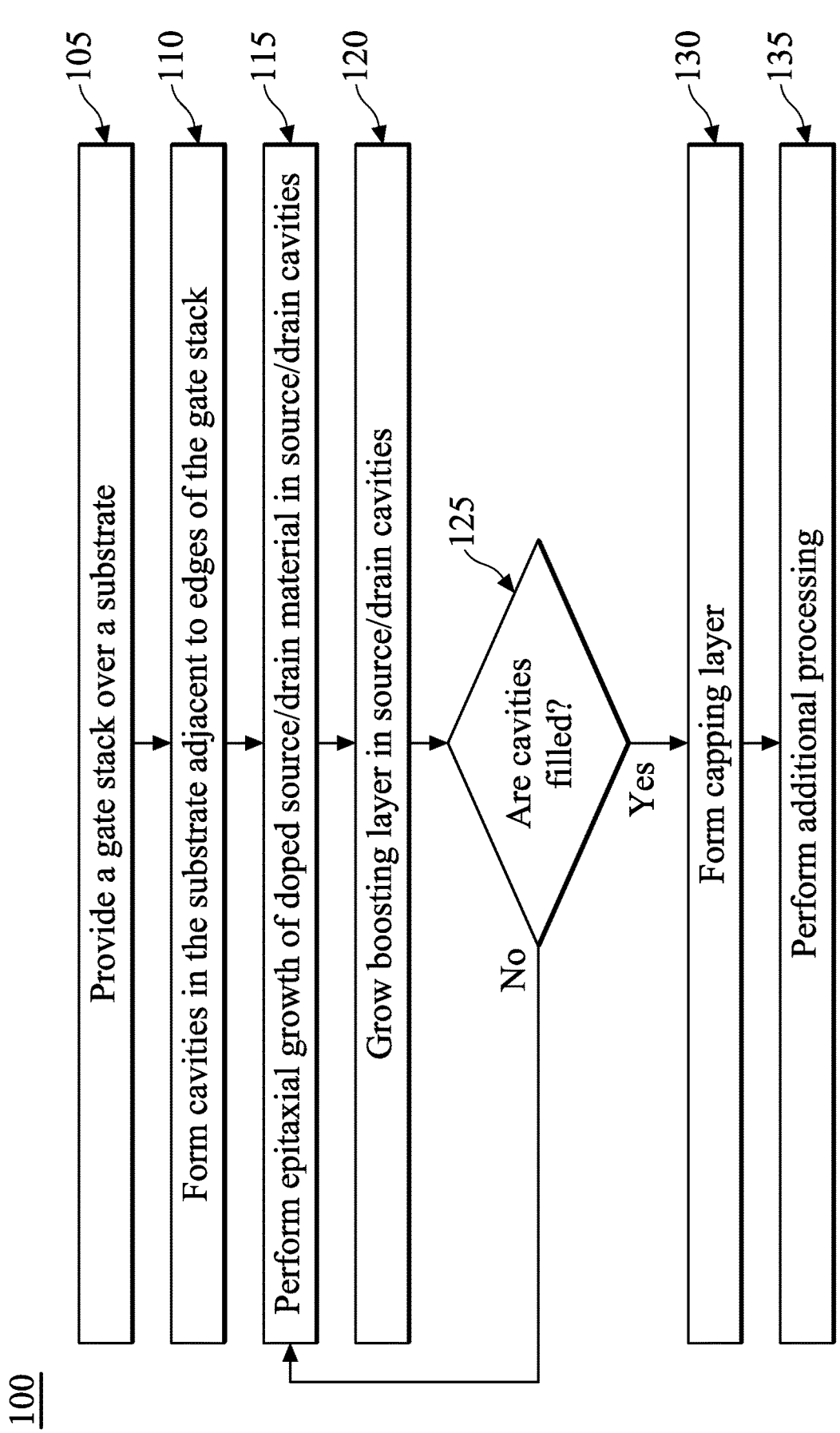
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When forming doped source/drain regions, such as source/drain regions of silicon doped with phosphorous, the dopant may not bond properly with the source/drain material, thereby creating point defects resulting from unbonded dopant. Point defects can include vacancies or interstitials in the crystalline structure. An accumulation of point defects can lead to an extended defect. Ideally, all the dopant will bond with the silicon to be interspersed throughout the crystalline lattice, however in practice, dopant can cluster in the lattice structure due to being unbonded with the source/drain material. When the dopant clusters, future annealing will not activate the dopant and it will remain inactive in the source/drain regions.

In embodiments which will be described in detail below, a layered growth of undoped source/drain material can provide many dangling bonds or vacancies in the crystalline structure. The undoped source/drain material can be referred to as a boosting layer. After a layered growth of undoped source/drain material, subsequent growth of doped source/drain material can be performed. The dangling bonds in the boosting layer can provide vacancies for the dopant to readily bond with the boosting layer. Where the dopant bonds with the boosting layer, a boost of dopant in the source/drain can be found. The boost can occur because of the increased availability of bonding opportunities subsequent to the formation of the boosting layer. As a result, the layered growth of boosting layers can improve performance of the source/drain regions by discouraging dopant cluster and increasing dangling bonds, thereby resulting in increased dopant bonding at the boosting layer. In some embodiments the source/drain material of the undoped source/drain material can be selected from a material that is different from the source/drain material of the doped source/drain material.

Embodiments of the present disclosure can boost dopant concentration of a doped source/drain area of a semiconductor device, such as a field effect transistor (FET). In some embodiments, the phosphorous concentration of a phosphorous doped source/drain area of an n-type semiconductor device, such as a FET, can be increased. In some embodiments, boron concentration of a boron doped source/drain area of a p-type semiconductor device, such as a FET, can be increased. In some embodiments, other dopants can be used. Such a device can include, for example, an n-type FET, a p-type FET, or a complementary metal oxide semiconductor (CMOS). A doped epitaxy can be grown in a recess formed in a semiconductor substrate, such as a recess for the formation of a source/drain area of a transistor. To reduce or prevent clustering of dopants, embodiments of the present disclosure increase the availability of bonding sites (i.e., dangling) to provide increased bond opportunities for dopant, resulting in increased bonding of dopants. This helps reduce or prevent extended defects in the crystalline and helps increase the amount of activated dopant in the region.

The following disclosure will be discussed with examples of n-type or p-type FETs to illustrate various embodiments of the present application. It should be understood, however, that the present application should not be limited to a particular type of device, except as specifically claimed. When a specific dopant, source/drain material, or boost layer material is mentioned, it should be understood that other dopants, source/drain materials, or boost layer materials can be used or substituted, as explained herein without undue experimentation.

With reference to FIGS. 1 and 2-8, a method 100 and a semiconductor device 200 are described below. The semiconductor device 200 refers to an integrated circuit, or a portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional steps can be provided before, during, or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

FIG. 1 illustrates a flow diagram, such as can be used in a method of fabricating a semiconductor device, in accordance with some embodiments. While the flow diagram is described briefly below, aspects are described in more detail with reference to later figures.

At 105, a gate stack is formed over a substrate. In an n-type device, the substrate can be a p-type silicon-based substrate. In some embodiments, the substrate can be a silicon-based substrate that has wells doped with p-type impurities. In a p-type device, the substrate can be an n-type silicon-based substrate. In some embodiments, the substrate can be a silicon-based substrate that has wells doped with n-type impurities. At 110, recessed cavities are formed in the substrate adjacent to the edges of the gate stack. The recessed cavities can be formed within the substrate or within a doped well formed in the substrate. The recesses can be formed by etching, for example using an isotropic dry etching process, a wet etching process, or a combination thereof.

At 115, source/drain features of the device are formed within the recessed cavities. The source/drain features can be formed using an epitaxial growth process. Acceptable epitaxial growth processes include selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the source/drain features have a lattice constant different from the substrate 202 to induce a strain or stress on the channel region of the semiconductor device 200, and therefore enable greater carrier mobility of the device to enhance the device performance. Materials that can be used for the epitaxy of the source/drain features include silicon, germanium, silicon germanium, carbon, silicon carbide, and so forth.

The epitaxial growth process of 115 can occur in the presence of a dopant to grow a doped source/drain epitaxy. For example, phosphorous can be used to grow a composition of silicon phosphorous. Other acceptable dopants can include, depending on whether the device is an n-type or p-type device, arsenic, antimony, lithium, boron, aluminum, nitrogen, gallium, indium, germanium, and so forth. A dopant based vapor and a source/drain material based vapor can be introduced in the growing chamber, which can provide materials for the growth of the doped source/drain epitaxy.

At 120, a boosting layer can be grown in the source/drain cavities at cyclical intervals such that the boosting layer is interspersed throughout the doped source/drain epitaxy. The same or different epitaxial growth technique as used in growing the doped source/drain epitaxy can be used to grow the boosting layer. In some embodiments, the dopant based vapor can be withheld from the chamber such that only the undoped source/drain material remains in the growth chamber. In such embodiments, the boosting layer comprises undoped source/drain materials substantially free of dopant. In some embodiments, the dopant based vapor and source/drain material based vapor can both be withheld from the growth chamber and one or more different boosting layer vapors introduced, such as a carbon based vapor. In such embodiments, the boosting layer can comprise a material other than the source/drain material or the dopant. Also, the lattice constant of the boosting layer can be different than the lattice constant of the doped source/drain material. The process of forming steps 115-125 will be discussed in greater detail below.

At 125, if the cavities are not yet filled, the flow will go back to 115 and 120 until the cavities are full. If the cavities are filled, the flow will continue on to 130.

At 130, a capping epitaxy can be formed over the layered source/drain features. In some embodiments, the capping epitaxy can be made of doped or undoped source/drain material. The capping epitaxy can be formed to overgrow the recess cavities of the source/drain regions. The capping epitaxy can be formed using the same or a different method of epitaxial growth as the source/drain materials. This will be discussed in greater detail below.

At 135, additional processing can be done, such as gate replacement, adding interlayer dielectrics, redistribution layers, contacts, silicides, metal features, and so forth. For example, the method 100 may proceed to form main spacers. Contact features, such as silicide regions, may also be formed. The contact features can include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate and a chemical mechanical polishing (CMP) process is further applied to the substrate to planarize the substrate. Further, a contact etch stop layer (CESL) may be formed on top of the gate structure before forming the ILD layer.

In some embodiments, a gate replacement process (or gate last process) is performed, where the polysilicon gate stack 250 is replaced with a metal gate. For example, a metal gate may replace the gate stack (i.e., polysilicon gate stack) of the gate stack 250. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof. In some embodiments, a gate first process can be used instead and no gate replacement is needed.

Subsequent processing may further form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The additional processing of 135 can also include annealing to activate the dopant of the source/drain regions.

Figure 2:
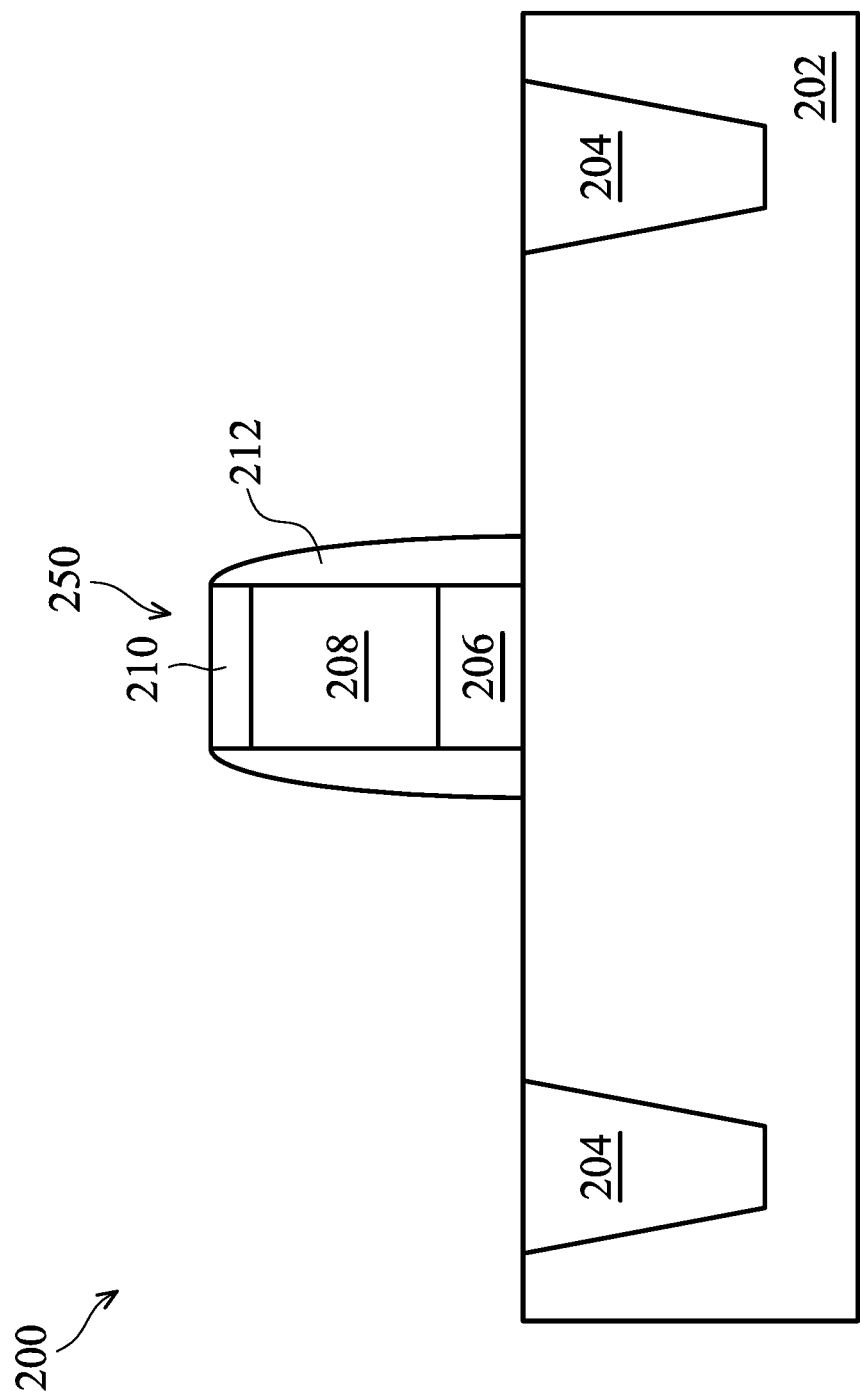
FIGS. 2 to 6 are cross-sectional side views of a semiconductor device at various stages of fabrication according to the method of FIG. 1 in accordance with one or more embodiments.

FIGS. 2 to 8 are cross-sectional gate-end views of the semiconductor device 200 at various stages of fabrication according to the method 100 of FIG. 1. Referring to FIGS. 1 and 2, the method 100 begins at step 105, wherein a gate stack 250 is formed over a substrate 202, and the gate stack 250 defines a channel region of the substrate 202 thereunder. In the some embodiments, the substrate 202 is a semiconductor substrate including silicon. In some embodiments, the substrate 202 includes an elementary semiconductor including silicon and/or germanium in crystal; a compound semiconductor including silicon carbide, gallium arsenic, gallium phosphorous, indium phosphorous, indium arsenide, and/or indium antimonide; an alloy semiconductor including SiGe, GaAsP, AlInAs, AlGaAs, GaInAs, GaInP, and/or GaInAsP; or combinations thereof. In another alternative embodiment, the semiconductor substrate can be a semiconductor on insulator (SOI).

The substrate 202 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 202, in a P-well structure, in an N-well structure, in a dual-well structure, or using a raised structure.

The substrate 202 can include an isolation feature 204 to define and isolate various active regions of the substrate 202. The isolation feature 204 can utilize isolation technology, such as shallow trench isolation (STI) or local oxidation of silicon (LOCOS), to define and electrically isolate the various regions. The isolation feature 204 can include silicon oxide, silicon nitride, silicon oxynitride, other suitable materials, or combinations thereof.

Still referring to FIG. 2, in some embodiments, the gate stack 250 is formed by sequentially depositing and patterning a gate dielectric layer 206, a gate electrode layer 208, and a hard mask layer 210 on the substrate 202. The gate dielectric layer 206, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In one embodiment, the gate dielectric layer 206 is a high-k dielectric layer. The gate dielectric layer 206 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 206 may further comprise an interfacial layer (not shown) between the gate dielectric layer 206 and the substrate 202. The interfacial layer may comprise silicon oxide.

The gate electrode layer 208 is formed on the gate dielectric layer 206. In some embodiments, the gate electrode layer 208 includes a single layer. In some embodiments, the gate electrode layer 208 is made up of multiple layers. The gate electrode layer 208 can be made of polysilicon. Further, the gate electrode layer 208 may be doped polysilicon with the same or different doping species. The gate electrode layer 208 may be formed using a process such as low-pressure chemical vapor deposition (LPCVD), plasma enhanced chemical vapor deposition (PECVD), other suitable processes, or combinations thereof. Next, the hard mask layer 210 is formed over the gate electrode layer 208 and a patterned photo-sensitive layer (not shown) is formed on the hard mask layer 210. The pattern of the photo-sensitive layer is transferred to the hard mask layer 210 and then transferred to the gate electrode layer 208 and the gate dielectric layer 206 to form the gate stack 250. In some embodiments, the hard mask layer 210 includes silicon oxide. In alternative embodiments, the hard mask layer 210 includes silicon nitride, silicon oxynitride, and/or other suitable dielectric materials, and may be formed using a method such as CVD or PVD. The hard mask layer 210 can be formed from two separate layers, including a silicon nitride pad layer and an oxide layer on top of the silicon nitride pad layer. The photo-sensitive layer is removed thereafter by a dry and/or wet stripping process.

Generally, photolithography techniques utilize a photoresist material (such as a photo resist) that is deposited, irradiated (exposed), and developed to remove a portion of the photoresist material. The remaining photoresist material protects the underlying material, such as the substrate 202 in this example, from subsequent processing steps, such as etching. In this example, the photoresist material is patterned to define an area of the hard mask layer 210 that will be etched and, conversely, an area of the hard mask 210 (and gate electrode layer 208 and gate dielectric layer 206) that will be protected from etchant.

With further referring to FIG. 2, sidewall spacers (or gate spacers) 212 are formed adjoining opposite sidewalls of the gate stack 250. In some embodiments, the sidewall spacers 212 include a single-layer or a multiple-layer structure. In some embodiments, a blanket layer of spacer material (not shown) is formed over the gate stack 250, and the substrate 202 by a depositing process including CVD, PVD, ALD, or other suitable techniques. In some embodiments, the spacer material comprises silicon oxide, silicon nitride, silicon oxy-nitride, other suitable material, or combinations thereof. Then, an anisotropic etching process is performed on the spacer material to form the sidewall spacers 212. The sidewall spacers 212 can protect the sidewalls of the gate stack 250. The sidewall spacers 212 can also be used to offset subsequently formed doped regions, such as heavily doped source/drain regions.

Figure 3:
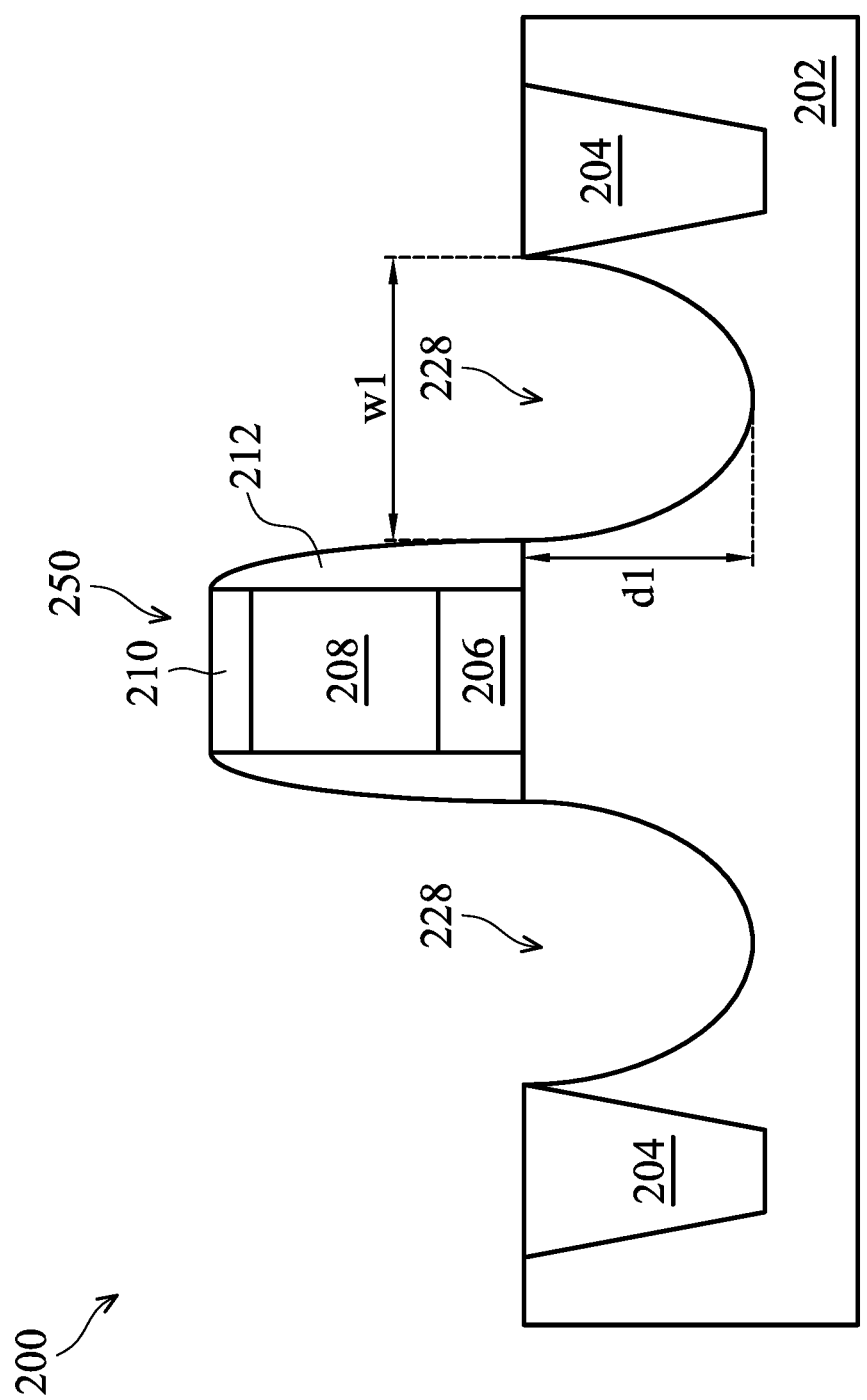

Referring to FIGS. 1 and 3, the method 100 proceeds to step 110 wherein recess cavities 228 are formed in the substrate 202. In some embodiments, the recess cavities 228 are source/drain recess cavities for the gate stack 250. The processes for forming the recess cavities 228 can include etching processes, including an isotropic dry etching process, an anisotropic wet etching process, an anisotropic dry etching process, or a combination thereof. In some embodiments, a protector (not shown) can be provided over other components (not shown) of the substrate 202, thereby preventing the substrate 202 and other components from being removed or damaged by the etching process. The protector, for example, can be a photoresist pattern or other suitable mask.

An etching process is performed to remove substrate 202 material to form initial recess cavities (not shown) adjacent to edges of the gate stack 250. In some embodiments, a combination etching process can include an isotropic dry etching process and a wet etching process. For example, a dry etching process can be used to form initial recess and a wet etching process can be used to enlarge the initial recess cavities to form the recess cavities 228. In some embodiments, the wet etching process can use a chemical including hydration tetramethyl ammonium (TMAH), or the like.

Figure 8:
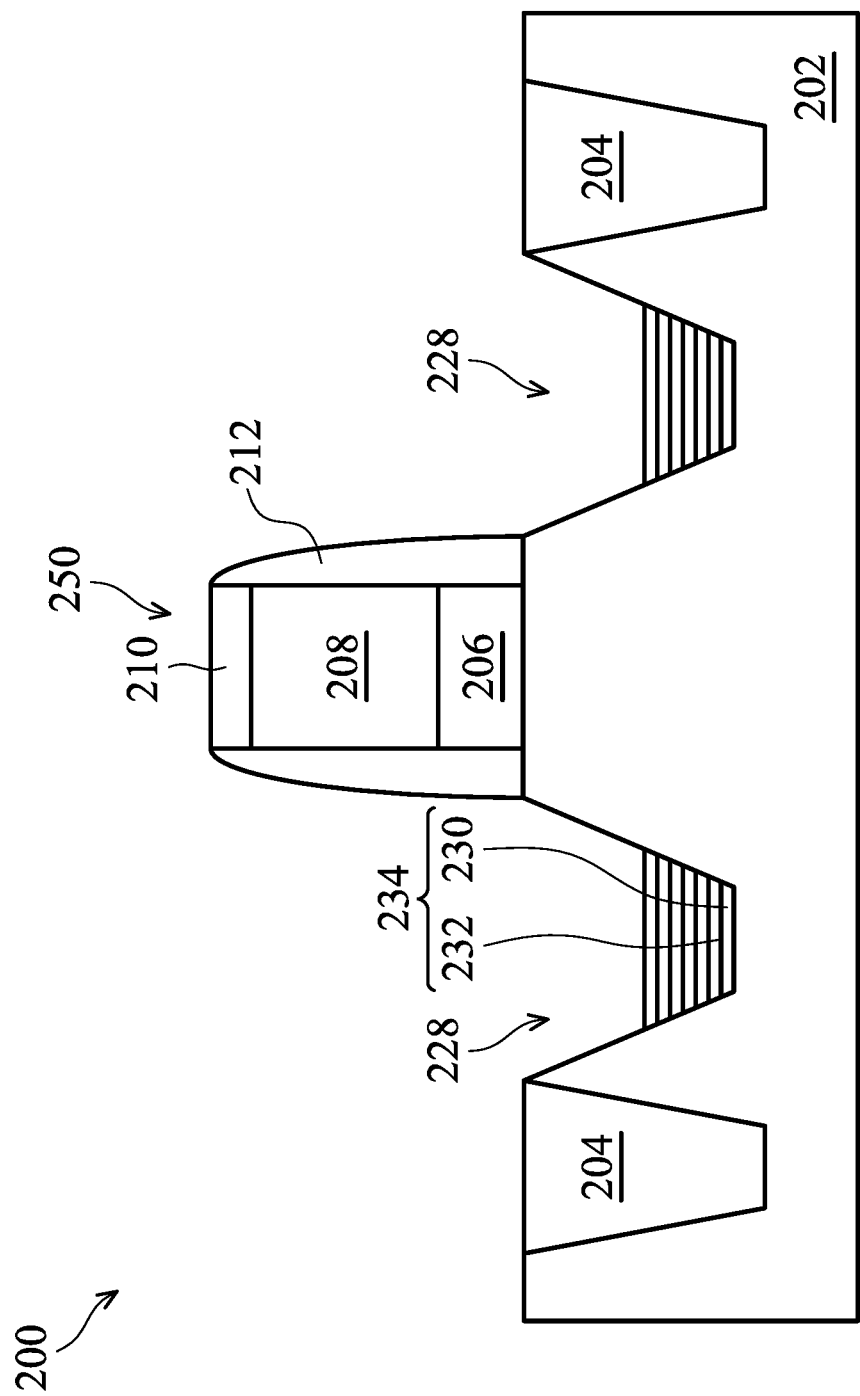
FIGS. 8 to 10 are cross-sectional side views of a semiconductor device in accordance with alternative embodiments.

The shape of the recess cavities 228 can vary based on the etching techniques and the crystal orientation of the substrate. For example, some crystal orientations may allow etched recesses to have inverse faceted side walls with tips protruding into the channel region (under the dummy gate stack or gate spacers). In some embodiments, the recess cavities 228 are wedge-shaped with tips extending into the substrate 202 and toward the channel region under the gate stack 250 (not shown). In some embodiments, the recess cavities 228 are bowl shaped. In some embodiments, the recess cavities are a tapered wedge-shape with sidewalls that taper toward a substantially flat bottom (such as illustrated in FIG. 8). In some embodiments, the recess cavities have substantially vertical sidewalls (not shown).

The process of forming the source/drain regions in accordance with embodiments of the disclosure is independent of the shape of the recess cavities 228. The devices and processes as described below is not dependent on the shape of the recess cavities 228. The recess cavities 228 can have a depth, d1, measured from the topmost surface of the substrate 202 to the bottom-most point of the recess cavities 228. The recess cavities 228 can have a width measurement, w1 measured across the width of the opening of the recess cavity 228 at the topmost surface of the substrate 202. The recess cavities 228 of the source/drain regions on either side of the gate stack 250 can have the same or different measurements for d1 and w1. In some embodiments, d1 can be in a range from about 30 nm to about 150 nm, such as about 100 nm. In some embodiments, w1 can be in a range from about 10 nm to about 70 nm, such as about 30 nm. In some embodiments, the depth d1 can be less than about 30 nm or more than about 150 nm, depending on the technique and design of the device. In some embodiments, the width w1 can be less than about 10 nm or more than about 70 nm, depending on the technique and design of the device.

Figure 4:
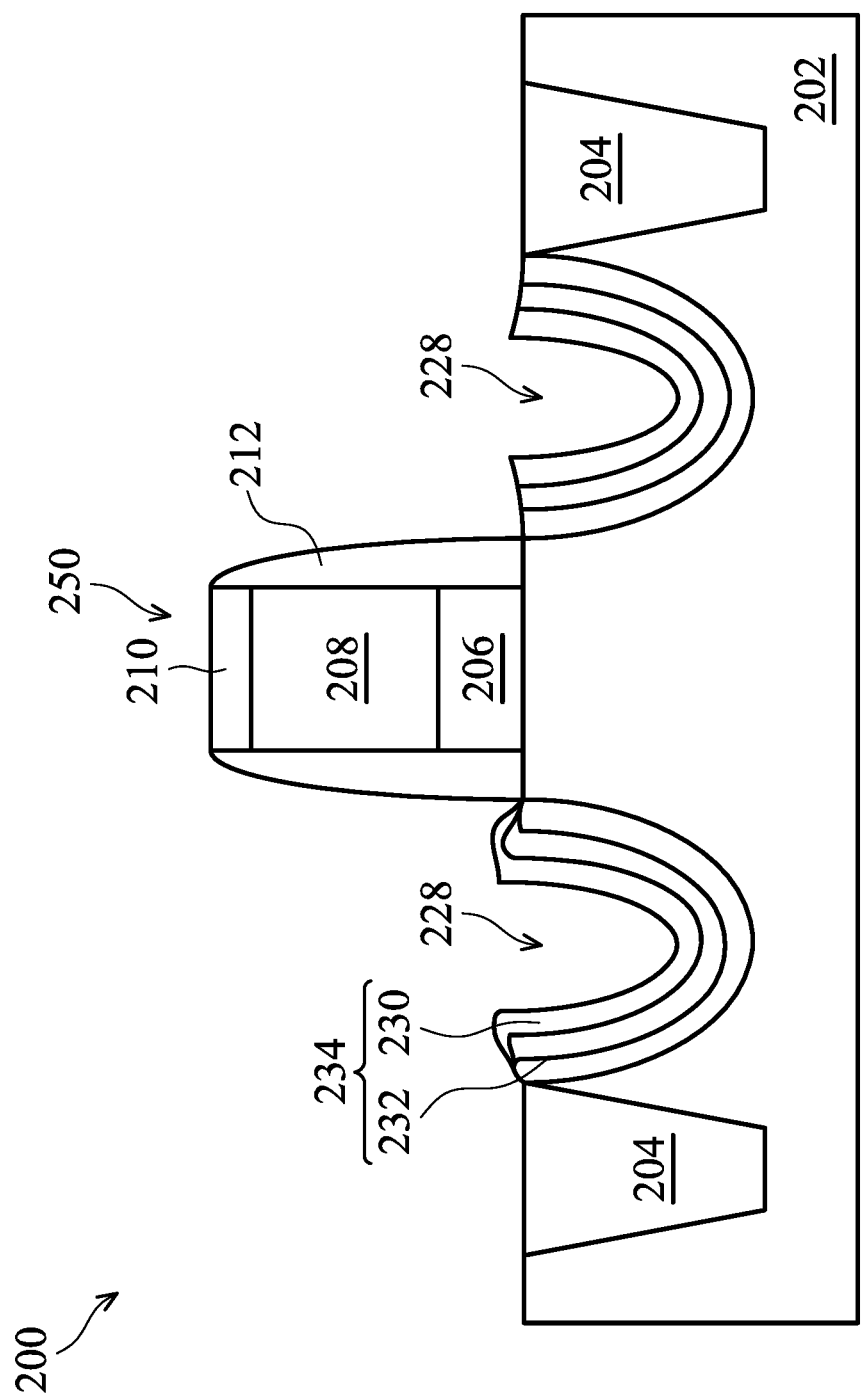

Referring to FIGS. 1 and 4, the method 100 proceeds to steps 115, 120, and 125, wherein source/drain features 234 are formed in the recess cavities 228 of the substrate 202.

The source/drain features 234 include alternating layers of a source/drain material 230 and a boosting layer 232 grown in the recess cavities 228.

Prior to forming the source/drain features 234, in some embodiments a pre-cleaning process can be performed to clean the recess cavities 228 using a chemical comprising hydrofluoric acid (HF) or other suitable solution.

Following the optional pre-cleaning, gaseous and/or liquid precursors may be provided to interact with the composition of the substrate 202 to form the strained material, such as silicon phosphorous (SiP), to begin to fill the recess cavities 228. In some embodiments, the source/drain materials can be formed at a temperature of about 600° to 750° C. and under a pressure of about 10 Torr to about 600 Torr, using suitable reaction gases.

The source/drain features 234 can be formed using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the source/drain material 230 has a lattice constant different from the substrate 202 to induce a strain or stress on the channel region of the semiconductor device 200. Materials that can be used for the epitaxy of the source/drain features include silicon, germanium, silicon germanium, carbon, silicon carbide, and so forth.

In some embodiments, the source/drain material 230 can be grown in the presence of a dopant to form a doped source/drain epitaxy. Acceptable dopants can include, depending on whether the device is an n-type or p-type device, phosphorous, arsenic, antimony, lithium, boron, aluminum, nitrogen, gallium, indium, germanium, and so forth.

The growth rate of the doped source/drain materials 230 can depend on a number of factors, including temperature and pressure. Also, the use of a dopant can dramatically change the growth rate. For example, undoped silicon in a particular environment can grow at 1-10 nm/s, while in the same environment, silicon phosphorous can grow at 0.1-1 nm/s, about ten times slower than silicon alone.

The source/drain materials 230 can be formed in a layer at about 2 nm to about 10 nm thick. Other thicknesses can also be used, such as thicknesses less than about 2 nm thick or greater than about 10 nm thick. Thickness of the source/drain material 230 layers can be selected for example, based on the size of the recess openings 228. The time given for growing each layer or portion of the source/drain material 230 will necessarily depend on the desired thickness and the growth rate of the doped source/drain material 230.

Referring to FIGS. 1 and 4, following the growth of a layer of source/drain materials 230, the method at 120 provides a layered growth of boosting material in a boosting layer 232. In some embodiments, the boosting layer can be grown in the same environment, including the same pressure and temperature, as the source/drain materials 230 layer. That is, the boosting layer can be grown by changing the composition of the vapors present in the growth chamber, without evacuating the chamber. For example, if the source/drain material 230 is silicon phosphorous, and the boosting layer is silicon, after the silicon phosphorous layer is formed, phosphorous can be withheld from the growth chamber briefly and a thin layer of silicon can be grown on the silicon phosphorous. Similarly, if the source/drain material is silicon germanium boron and the boosting layer is silicon germanium, after the silicon germanium boron layer is formed, boron can be withheld from the growth chamber briefly and a thin layer of silicon germanium can be grown on the silicon germanium boron. The boosting layer can be substantially free of dopant to leave holes for dopant bonding when dopant is reintroduced in the growth chamber.

In some embodiments, the boosting layer 232 can comprise other materials, including, for example, carbon or silicon carbon where the source/drain material is doped silicon, silicon germanium, or germanium. Any suitable material can be used which would provide vacancies for dopant bonding of the doped source/drain material 230. In such embodiments, the boosting layer can be grown in the same or a different growth chamber under other environmental conditions as appropriate for the boosting layer composition. For example, for a carbon boosting layer, the vapor for the source/drain material and the vapor for the dopant can be withheld from the chamber and a vapor form of carbon introduced which can form an epitaxy on the source/drain material 230.

In some embodiments, the boosting layer 232 can have a lattice mismatch with the source/drain materials 230. For example, where the boosting layer 232 is carbon based and the source/drain materials 230 is silicon based, the crystalline structure from one to the other can be different.

In some embodiments, the boosting layer 232 can be formed in a layer at about 1 nm to about 5 nm thick. Other thicknesses can also be used, such as thicknesses less than about 1 nm thick or greater than about 5 nm thick. The time given for growing each boosting layer 232 will necessarily depend on the growth rate and desired thickness of the boosting layer. For example, a silicon boost layer between about 1 nm and about 5 nm can be grown in about 0.1 s to about 5 s, depending on the pressure and temperature of the growth chamber.

In some embodiments, such as illustrated in the left hand recess 228, the boosting layer 232 can be formed over the entire source/drain structure each time the boosting layer 232 is formed. Then, subsequently, a source/drain material layer 230 can be formed completely over the previous boosting layer 232. In other embodiments, such as illustrated in the right hand recess 228 of FIG. 4, the boosting layer 232 may be inhibited from growing over the top of the already formed source/drain materials 230. It can be inhibited, for example, by the presence of etchant gases in the growth chamber or can be grown and removed by subsequent etching that leaves the boosting layer 232 in the recess 228, but removes all or most of the boosting layer 232 that may grow on top of the already formed source/drain materials 230.

Referring to FIGS. 1 and 4, the method at 125 provides that if the recess 228 is not yet filled with the source/drain features 234, the process will continue to alternately grow the source/drain material 230 and boosting layer 232 until the source/drain features 234 are completely formed. FIG. 4 illustrates the process of forming the source/drain features 234 at a point partially through the formation. In some embodiments, the boosting layers 232 can continue to be periodically grown throughout the formation of the source/drain features 234. In some embodiments, the boosting layers 232 can be periodically grown for only part of the formation of the source/drain features 234. For example, a number of boosting layers can be used to partially form the source/drain features 234, partially filling the recess 228.

Then, the rest of the source/drain features 234 can be formed with doped source/drain material 230, filling the remainder of the recess 228. Or for example, an initial epitaxy of doped source/drain material 230 can be grown to partially form the source/drain features 234, partially filling the recess 228. Then, a number of boost layers 232 periodically formed toward the end of the formation of the source/drain features 234, filling the remainder of the recess 228. Embodiments can grow a number of boost layers 232, such as about one to twenty layers or more.

Figure 5:
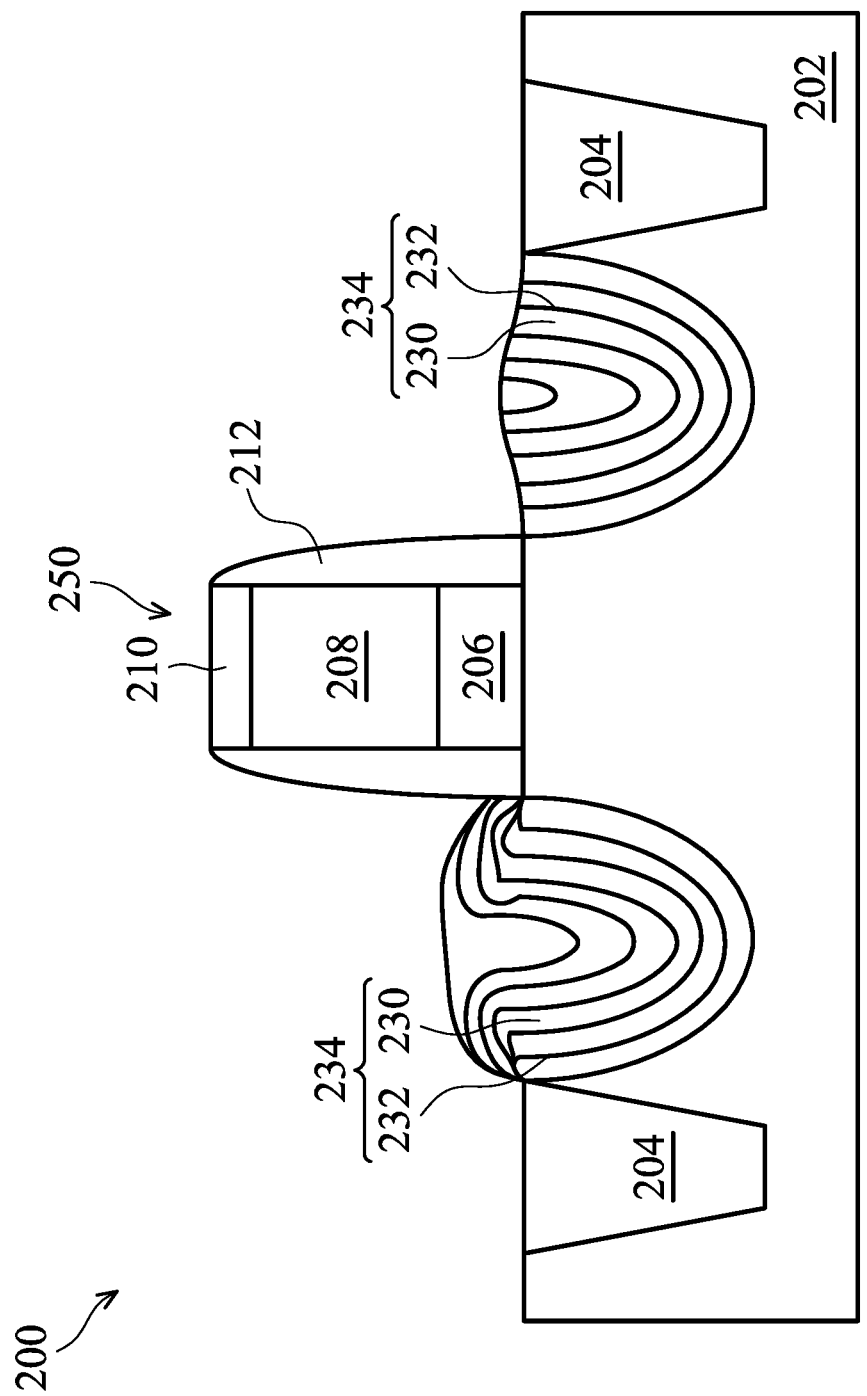

FIG. 5 illustrates the process of forming the source/drain features 234 at a point where the recesses 228 have been filled. It should be noted that a top surface of the source/drain features 234 can protrude from the recesses 228, such as illustrated in FIG. 5. As discussed above, etchant gases in the chamber while epitaxial growth occurs can inhibit or control growth of the source/drain material 230 and/or boosting layer 232. The shape and contour of the source/drain material 230 and boosting layer 232 will depend on how the etchant gases act on the source/drain material 230 and boosting layer 232. The left hand illustrated source/drain feature 234, for example, shows less inhibited growth of the boosting layer 232 over the already formed source/drain materials 230, whereas the right hand illustrated source drain/feature 234, for example, shows more inhibited growth of the boosting layer 232 over the already formed source/drain materials 230.

Figure 6:
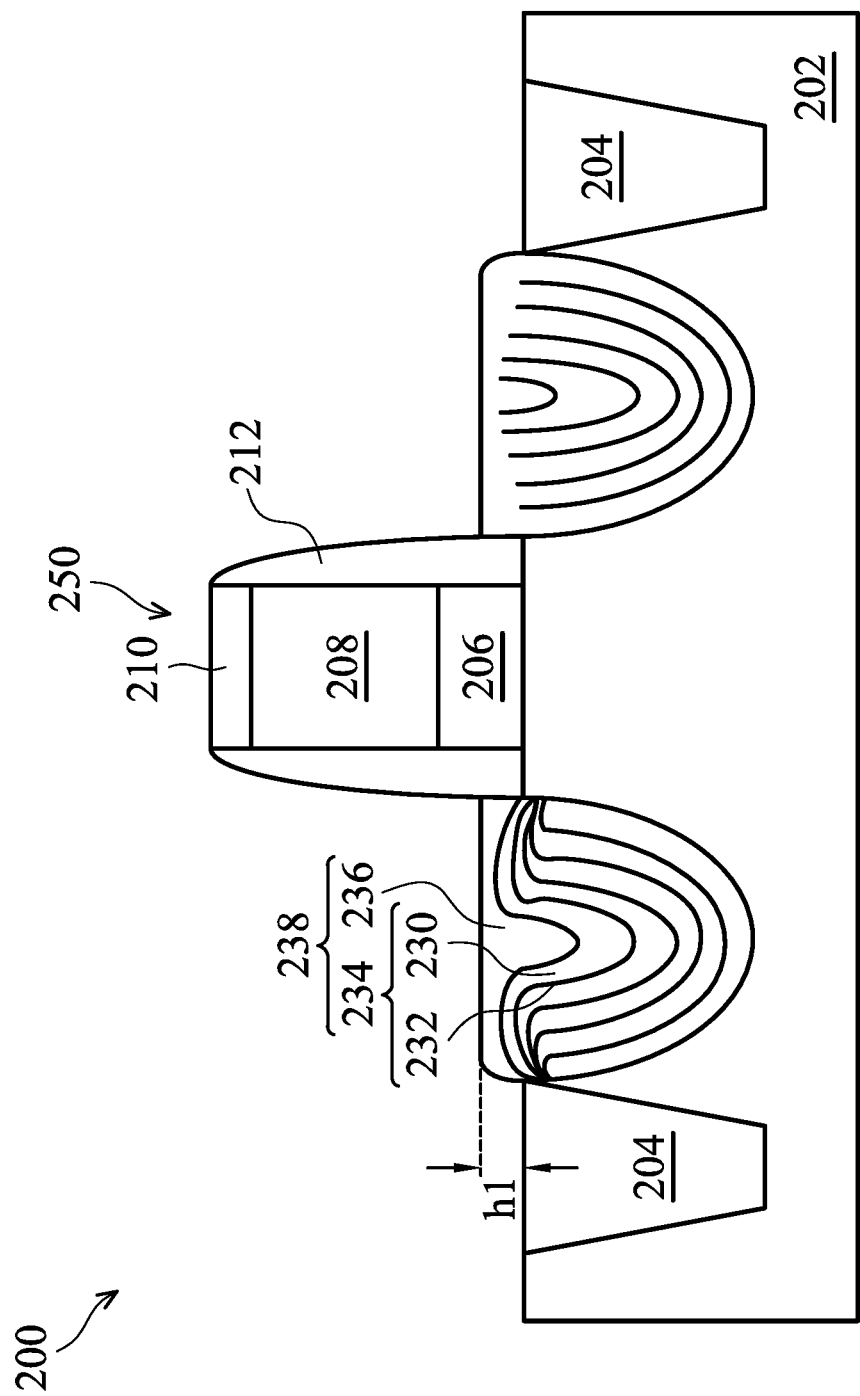

Referring to FIG. 6, in some embodiments, a capping layer 236 can be formed over the source/drain features 234 to form capped source/drain features 238. The capping layer 236 may function as a protection layer to prevent the underlying source/drain features 234 from being over-etched in a subsequent processing. In some embodiments, the capping layer 236 has a thickness ranging between about 1 nm and about 20 nm. The capping layer 236 can be formed from the same material as the source/drain material 230 to overgrow the recess cavities 228 of the source/drain features 234. The capping layer 236 can be formed using the same or a different method of epitaxial growth as the source/drain materials 230 or boosting layers 232. Other appropriate epitaxial growth methods are listed above and are not repeated. The capped source/drain features 238 can have a top surface higher than the top surface of the substrate. In some embodiments, the capped source/drain features 238 has a top surface higher than the top surface of the substrate 202 with a height difference, hl, ranging between about 0 nm to about 20 nm. In some embodiments, the capping layer 236 can extend over the isolation feature 204. In some embodiments, the capping layer can result in a faceted shape above the recesses 228.

In some embodiments, the capping layer 236 can be formed incrementally along with each of the source/drain material 230 layers. For example, a source/drain material 230 layer can be formed along with a capped portion, then a boosting layer 232 formed, then another source/drain material 230 layer formed along with a capped portion, and so forth, such as depicted by the left hand source/drain feature 234 in FIG. 5. Because the boosting layers 232 are relatively thin, remaining unbonded phosphorous can diffuse when the dopant is activated. The resulting boosting layer 232 after activation can have portions that are integrated into the source/drain materials 230 and can have other portions that remain distinctive from the source/drain materials 230. Portions of the boosting layer 232 after activation can have a crystalline structure that is different from the source/drain material layers' crystalline structure after activation. Other portions of the boosting layer 232 can recrystallize during activation so that after activation, they are integrated into the source/drain materials 230.

Figure 7:
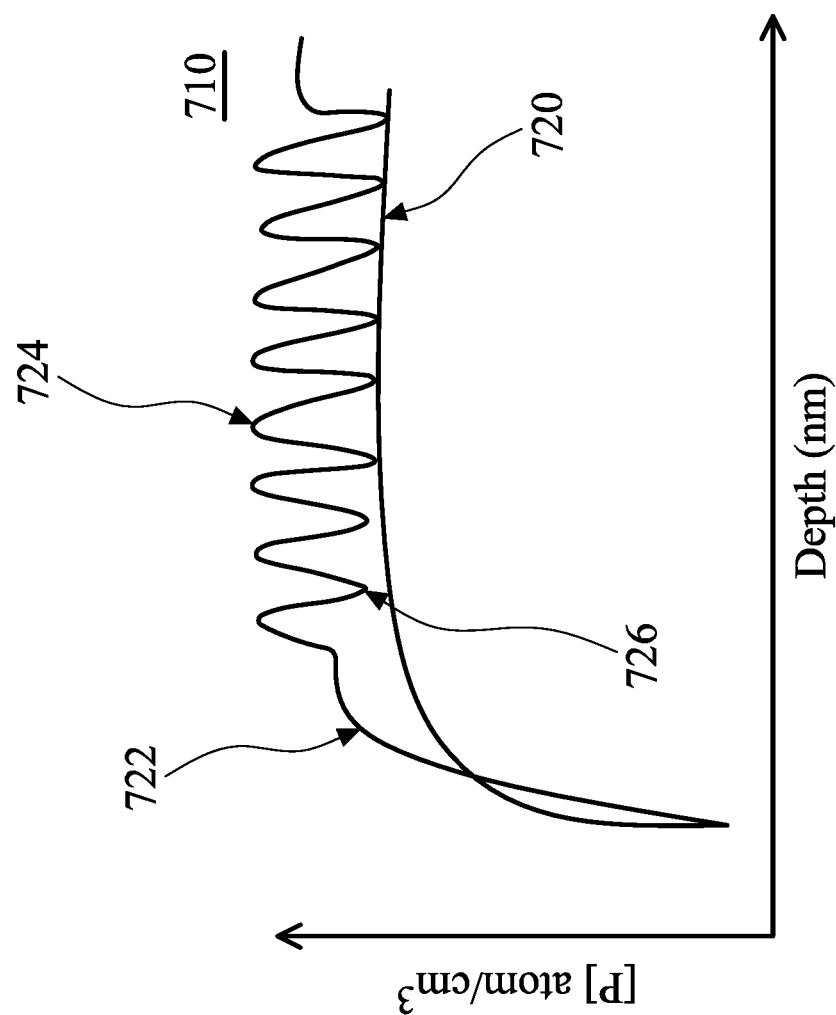
FIG. 7 illustrates a concentration of phosphorous in a source/drain region formed from silicon phosphorous, in accordance with some embodiments.

Referring to FIG. 7, a graph 710 illustrates a concentration of bonded phosphorous in atoms per cubic centimeter as depth is increased into a source/drain region. The line 720 represents a source/drain region conventionally formed, i.e., without using boosting layers 232. As can be seen in graph 710, the concentration 720 of bonded phosphorous is relatively stable, but begins to taper off as depth is increased. The line 722 illustrates a concentration of bonded phosphorous in atoms per cubic centimeter as depth is increased into a source/drain region formed consistent with embodiments discussed above. In this instance, the source/drain materials are selected to be phosphorous doped silicon and the boosting layers are silicon. Peak 724 illustrates an increase in bonded phosphorous in the source/drain region at a boosting layer 232. Because the boosting layer provides many bonding opportunities for (in this case) phosphorous, the concentration of bonded phosphorous at the boosting layer is elevated. As illustrated by valley 726, as the thickness of the doped source/drain materials 230 increases, the concentration of bonded phosphorous diminishes until another boosting layer is reached. The valley 726 is approximately the same value as the concentration 720 at a given depth. Thus, it can be seen that bonded dopant concentration is elevated overall when boosting layers are used in the formation of the source/drain regions.

Alternating peaks 724 and valleys 726 of the concentration of dopant illustrates a gradient of dopant concentration as depth into the source/drain region is increased.

Figure 9:
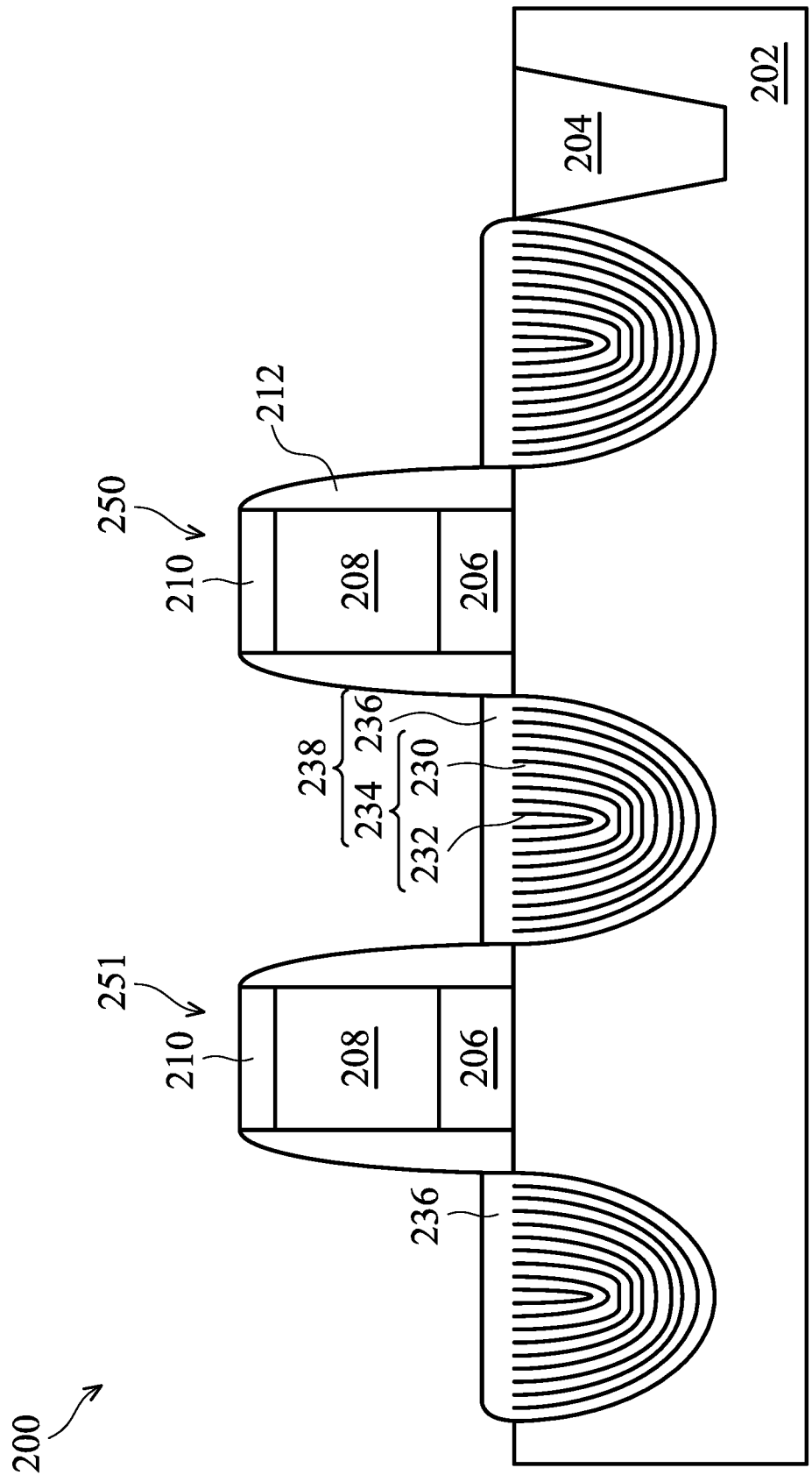
Figure 10:
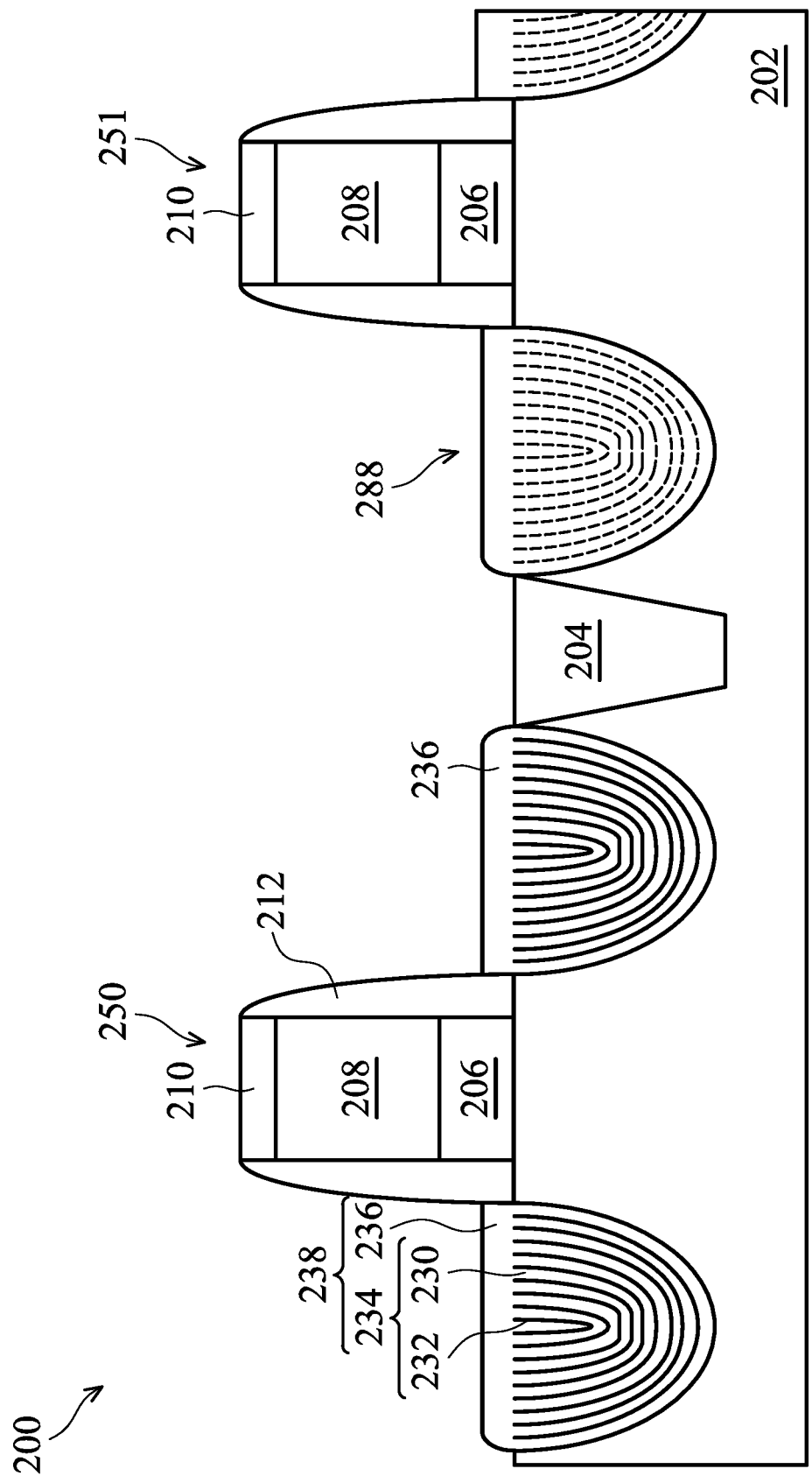

FIGS. 8 through 10 illustrate alternative embodiments that are contemplated by using the layering method to form a structure consistent with such embodiments.

Referring to FIG. 8, the structure 200 has recessed cavities 228 that are of a different shape than the shape referred to in previous figures. This illustrates that the source/drain features 234 can be formed in any shape recess opening.

Also, FIG. 8 illustrates that the formation of the source/drain features by alternating growth for the source/drain materials 230 and boosting layer 232 can proceed differently than previously depicted. Rather than follow the contour of the recessed opening, the epitaxial material can be grown from the bottom of the recessed opening 228 upwards. In some embodiments, etchant gasses, such as argon, can be in the growth chamber while the growth of the source/drain features 234 occurs. The presence of etchant gasses can cause the sidewalls of the recesses 228 to be cleaned of growing source/drain features. For example, if the level of etchant gasses is higher, then more growth will be inhibited or removed. In some embodiments, the concentration of etchant gasses can be increased or decreased to control growth of the source/drain features 234, as desired.

Referring to FIG. 9, the structure 200 has three capped source/drain features 238 and two gate structures 250/251. Each of the capped source/drain features 238 can be formed using any of the above described techniques of forming a boosting layer 232 in a doped source/drain material 230. One of skill in the art will recognize that additional gate structures and source/drain features using these techniques can be added according to any desired design configuration.

Referring to FIG. 10, the structure 200 has four source/drain regions, including two capped n-type source/drain features 238 and two capped p-type source/drain features 288. The gate stacks 250/251 can be formed as described above. Capped source/drain features 238/288 can be formed using any of the above described techniques of layering a boosting layer 232 in a source/drain material epitaxy 230. For example, in the capped source/drain features 238, the boosting layer can comprise silicon and the source/drain material can comprise silicon doped with phosphorous or another n-type dopant. For example, in the capped source/drain features 288, the boosting layer can comprise silicon germanium and the source/drain material can comprise silicon germanium doped with boron or another p-type dopant. Other materials can be used, as described above. In some embodiments, gate stack 251 can be associated with P-type transistor, such as a p-type MOS (PMOS) and gate stack 250 can be associated with an N-type transistor, such as an n-type MOS (NMOS). Structure 200 can be used in a CMOS device. In such embodiments, during the epitaxial growth and layering using for forming the source/drain features 238, a mask layer (not pictured) can be formed over the source/drain regions 288 to provide protection and prevent unwanted growth and formation of materials therein. Likewise, during the epitaxial growth and layering using for forming the source/drain features 288, a mask layer (not pictured) can be formed over the source/drain regions 238 to provide protection and prevent unwanted growth and formation of materials therein.

Embodiments can provide a dopant boost in the source/drain regions of a structure or device, such as an n-type or p-type transistor. The disclosed device can be used in various applications such as digital circuits, imaging sensor devices, a hetero-semiconductor device, dynamic random access memory (DRAM) cells, a single electron transistor (SET), and/or other microelectronic devices (collectively referred to herein as microelectronic devices). Of course, aspects of the present disclosure are also applicable and/or readily adaptable to other types of transistor, including single-gate transistors, double-gate transistors, and other multiple-gate transistors, and may be employed in many different applications, including sensor cells, memory cells, logic cells, and others.

One embodiment is a semiconductor device that includes a substrate that has recess formed within. A doped epitaxy of a first material is formed in the recess. The doped epitaxy comprises a plurality of first material layers and one or more boosting layers comprising a second material, where each one of the one or more boosting layers is between two of the first material layers. A gradient of dopant concentration is formed within the doped epitaxy from layer to layer.

Another embodiment is a method that includes forming a recess in a substrate, the recess corresponding to a source/drain feature. A first doped epitaxy layer which includes a first material is grown in the recess. A boosting layer is grown over the first doped epitaxy layer. The boosting layer includes a second material different from the first material. A second doped epitaxy layer which includes the first material is grown over the boosting layer.

Another embodiment is a method that includes etching a recess in a semiconductor substrate. A boosting layer is grown in the recess, where the boosting layer is substantially free of dopant. A layer of doped source/drain material is grown in the recess on the boosting layer, where the doped source/drain material includes the dopant. During the growing of the layer of doped source/drain material, the dopant bonds with the boosting layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a doped epitaxy embedded in a substrate, the doped epitaxy comprising:
a plurality of doped first material layers comprising a first material and a dopant, the dopant including arsenic, antimony, lithium, boron, phosphorous, aluminum, nitrogen, gallium, or indium; and
one or more boosting layers comprising the first material, the dopant, and a second material, the first material being a semiconductor material, the second material being carbon, each one of the one or more boosting layers being between two layers of the plurality of doped first material layers, each of the one or more boosting layers being thinner than the each of the plurality of doped first material layers, wherein a gradient of dopant concentration is formed within the doped epitaxy from layer to layer, wherein a peak concentration of the dopant is higher in each of the boosting layers than a peak concentration of the dopant in each of plurality of doped first material layers.

2. The semiconductor device of claim 1, wherein the plurality of doped first material layers each comprises an n-type dopant as the dopant and silicon as the first material.

3. The semiconductor device of claim 1, wherein the plurality of doped first material layers each comprises a p-type dopant as the dopant and silicon germanium as the first material.

4. The semiconductor device of claim 1, further comprising a capping layer formed over the doped epitaxy, the capping layer comprising a same material as the plurality of doped first material layers.

5. The semiconductor device of claim 4, wherein the capping layer has a top surface of between about 0 nm and 20 nm higher than a top surface of the substrate.

6. The semiconductor device of claim 1, wherein each of the plurality of doped first material layers has a first crystalline structure, and wherein a portion of the one or more boosting layers has a second crystalline structure different from the first crystalline structure.

7. The semiconductor device of claim 1, wherein a thickness of each of the one or more boosting layers is about 1 nm to about 5 nm and a thickness of each of the plurality of doped first material layers between a pair of boosting layers is about 2 nm to about 10 nm.

8. The semiconductor device of claim 1, wherein, for a first boosting layer of the one or more boosting layers, the first boosting layer being interposed between a first doped layer of the plurality of doped first material layers and a second doped layer of the plurality of doped first material layers, a first gradient of dopant concentration increases from the first boosting layer toward the first doped layer and a second gradient of dopant concentration increases from the first boosting layer toward the second doped layer.

9. A device comprising:
a first transistor and a second transistor, the first and second transistors configured to operate in a complimentary manor;
a first source/drain region of the first transistor, the first source/drain region comprising:
a first semiconductor material, and
a first dopant in the first semiconductor material, the first dopant having alternating gradients of concentration in the first source/drain region, the first dopant comprising an n-type dopant, wherein first peaks and first valleys of the alternating gradients of concentration of the first dopant extend horizontally from a first vertical sidewall of the first source/drain region at a channel region of the first transistor to a second vertical sidewall of the first source/drain region, the first dopant at a lateral center of the first semiconductor material corresponding to a center valley of the first valleys, the center valley interposed between two peaks of the first peaks; and
a second source/drain region of the second transistor, the second source/drain region comprising:
a second semiconductor material different than the first semiconductor material, and
a second dopant in the second semiconductor material, the second dopant having alternating gradients of concentration in the second source/drain region, the second dopant comprising a p-type dopant.

10. The device of claim 9, further comprising:
one or more material layers interspersed in the first source/drain region, the one or more material layers comprising the first semiconductor material and carbon.

11. The device of claim 10, wherein the one or more material layers each correspond to peaks of concentration in the alternating gradients of concentration of the first dopant in the first source/drain region.

12. The device of claim 9, wherein the first source/drain region has a first portion embedded in a substrate and a second portion extending above the substrate, wherein the alternating gradients of concentration are in the first portion and not in the second portion of the first source/drain region.

13. The device of claim 9, further comprising:
a first gate stack disposed over a first channel region adjacent to the first source/drain region, wherein the first semiconductor material has a first lattice constant different from a second lattice constant of the first channel region, wherein the first semiconductor material exhibits a compressive strain on the first channel region; and
a second gate stack disposed over a second channel region adjacent to the second source/drain region.

14. The device of claim 9, wherein the first source/drain region and the second source/drain region are embedded in a substrate, further comprising:
an isolation structure embedded in the substrate, the isolation structure interposed between the first source/drain region and the second source/drain region.

15. A device comprising:
a first source/drain region embedded in a substrate, the first source/drain region comprising:
a first semiconductor material, semiconductor material being silicon and germanium,
a first dopant different from the first semiconductor material, the first dopant being a p-type dopant, and
a first plurality of boosting layers disposed in the first source/drain region, the first plurality of boosting layers comprising the first semiconductor material and a second dopant different than the first dopant and different than the first semiconductor material, wherein a concentration of the first dopant peaks at each of the first plurality of boosting layers, and wherein the concentration of the first dopant decreases on each side of each of the first plurality of boosting layers; and a first gate stack disposed over a first channel region of the substrate, the first channel region adjacent the first source/drain region.

16. The device of claim 15, further comprising:

a second source/drain region embedded in the substrate, wherein the first gate stack interposed between the first source/drain region and the second source/drain region.

17. The device of claim 16, further comprising:

a third source/drain region embedded in the substrate, the third source/drain region comprising: a second semiconductor material different than the first semiconductor material, a third dopant different from the first dopant and different from the second dopant, the third dopant having an opposite conductivity than the first dopant, and a second plurality of boosting layers comprising the third dopant, wherein a concentration of the third dopant has a peak at each of the first plurality of boosting layers, and wherein a concentration of the third dopant has a valley between two adjacent boosting layers of the second plurality of boosting layers;

a fourth source/drain region embedded in the substrate; and a second gate stack disposed over a second channel region of the substrate, the second gate stack interposed between the third source/drain region and the fourth source/drain region, wherein the first gate stack and the second gate stack are configured to operate in a complementary manor.

18. The device of claim 15, wherein the second dopant comprises carbon.

19. The device of claim 15, wherein the first source/drain region further comprises a capping layer comprising the first semiconductor material protruding above an upper surface of the substrate, the capping layer free of any of the first plurality of boosting layers.

20. The device of claim 15, wherein the first dopant at a side-to-side center of the first source/drain region is interposed between two legs of a first boosting layer of the first plurality of boosting layers, wherein the two legs of the first boosting layer are surrounded by a first reduced dopant region, wherein the first reduced dopant region is interposed between another two legs of a second boosting layer of the first plurality of boosting layers.

* * * * *

UNITED STATES PATENT AND TRADEMARK OFFICE
CERTIFICATE OF CORRECTION

PATENT NO. : 11,721,760 B2
APPLICATION NO. : 16/690194
DATED : August 8, 2023
INVENTOR(S) : Ma et al.

Page 1 of 1

It is certified that error appears in the above-identified patent and that said Letters Patent is hereby corrected as shown below:

In the Claims

In Column 14, in Claim 15, Line 58, delete "material, semiconductor" and insert -- material, the first semiconductor --.

Signed and Sealed this
Seventh Day of November, 2023

Katherine Kelly Vidal
*Director of the United States Patent and Trademark Office*